(12) United States Patent
Jing (10) Patent No.: US 12,366,607 B2
(45) Date of Patent: Jul. 22, 2025

(54) FAULT DETECTION CIRCUIT (71) Applicant: Texas Instruments Incorporated, Dallas, TX (US)

(72) Inventor: Weibing Jing, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/477,128

(22) Filed: Sep. 28, 2023

(65) Prior Publication Data

US 2025/0110176 A1 Apr. 3, 2025

(51) Int. Cl.
*G01R 31/319* (2006.01)
*G01R 31/317* (2006.01)
*G01R 31/3193* (2006.01)

(52) U.S. Cl.
CPC . *G01R 31/31922* (2013.01); *G01R 31/31712* (2013.01); *G01R 31/31932* (2013.01)

(58) Field of Classification Search
CPC ........ G01R 31/31922; G01R 31/31712; G01R 31/31932
USPC .......................................................... 714/724
See application file for complete search history.

(56) References Cited

U.S. PATENT DOCUMENTS

| | | | |
|---|---|---|---|
| 3,757,302 A | 9/1973 | Pollitt | |
| 6,000,042 A * | 12/1999 | Henrie | G06F 11/2015 714/E11.154 |
| 6,275,958 B1 * | 8/2001 | Carpenter | H02M 3/158 714/48 |
| 8,085,516 B1 * | 12/2011 | Armstrong | H02H 3/335 361/45 |
| 8,407,540 B2 * | 3/2013 | Chandra | G01R 31/31726 327/202 |
| 9,906,214 B2 * | 2/2018 | Mourrier | H02H 7/122 |
| 12,126,253 B2 * | 10/2024 | Liu | H02M 1/32 |
| 2014/0286056 A1 | 9/2014 | Yoon | |
| 2018/0316180 A1 * | 11/2018 | Batenburg | H02H 1/0007 |
| 2021/0184583 A1 * | 6/2021 | Tanghe | H02M 1/08 |
| 2022/0200438 A1 * | 6/2022 | Ahmed | H02M 7/21 |
| 2022/0311336 A1 | 9/2022 | You | |

FOREIGN PATENT DOCUMENTS

EP 2982997 B1 5/2024

OTHER PUBLICATIONS

International Search Report mailed Dec. 19, 2024.

* cited by examiner

*Primary Examiner* — James C Kerveros
(74) *Attorney, Agent, or Firm* — Valerie M. Davis; Frank D. Cimino (57) ABSTRACT

Fault detection circuits and methods. An example of a fault detection circuit includes a comparator configured to compare a voltage at a voltage terminal with a reference voltage, a digital logic circuit coupled to a test terminal and configured to receive, responsive to the voltage at the voltage terminal being less than the reference voltage as indicated by the comparator, a test signal, the digital logic circuit including at least one digital logic gate, and an edge detection circuit configured to (a) monitor a signal produced at an output of the at least one digital logic gate, and (b) based on the signal failing to transgress a threshold within a time period, providing a fault signal indicating detection of a fault at the test terminal.

26 Claims, 7 Drawing Sheets

FAULT DETECTION CIRCUIT

TECHNICAL FIELD

This description relates to fault detection circuits, and more particularly, to circuits for fault detection in switching voltage regulators.

BACKGROUND

Switching voltage regulators are used in a wide variety of applications, such as electronic systems for automotive applications, computers, phones, home appliances, etc. Some switching voltage regulator circuits involve the use of one or more power transistors capable of handling relatively high voltage and/or current. In certain circumstances, if a fault condition, such as a short or open condition associated with one or more components associated with the power transistor(s) occurs, it can cause potentially damaging current and/or voltage conditions in circuitry downstream of the power transistor(s). However, detecting the existence of such fault conditions, particularly in time to avoid damage to the circuit, can be complex and/or challenging.

SUMMARY

According to one example, a fault detection circuit comprises a first logic gate having a first input terminal coupled to a test terminal, a second logic gate having a first input terminal coupled to a test signal terminal and an output terminal coupled to a second input terminal of the first logic gate, a first sequential logic device, and a voltage comparator having first and second comparator input terminals and a comparator output terminal, the first comparator input terminal coupled to a voltage terminal, the second comparator input terminal coupled to a reference voltage terminal, and the comparator output terminal coupled to an input terminal of the first sequential logic device. The fault detection circuit may further include a delay device coupled between the test signal terminal and a second input terminal of the second logic gate, and a digital logic circuit coupled to an output terminal of the first logic gate and having at least one fault detection output terminal.

According to another example, a fault detection circuit for detecting a fault condition in a switching voltage regulator comprises a voltage comparator having first and second comparator input terminals and a comparator output, the first comparator input terminal coupled to a reference voltage terminal. The fault detection circuit may further include a digital logic circuitry coupled to a test terminal, a test signal terminal, and the comparator output terminal, and a delay device coupled between the test signal terminal and the digital logic circuitry. The delay device may be configured to produce a delayed copy of a test signal applied at the test signal terminal. The digital logic circuitry may be configured to produce a monitor signal based on a combination of the test signal, the delayed copy of the test signal, and a test voltage at the test terminal, and to produce a fault signal indicative of the fault condition based on a failure of the monitor signal to transgress a threshold value within a time period.

According to another example, a fault detection circuit comprises a comparator configured to compare a voltage at a voltage terminal with a reference voltage, and a digital logic circuit coupled to a test terminal and configured to receive, responsive to the voltage at the voltage terminal being less than the reference voltage as indicated by the comparator, a test signal, the digital logic circuit including at least one digital logic gate. The fault detection circuit may further include an edge detection circuit configured to (a) monitor a signal produced at an output of the at least one digital logic gate, and (b) based on the signal failing to transgress a threshold within a time period, providing a fault signal indicating detection of a fault at the test terminal.

According to another example, a fault detection method comprises comparing a voltage at a voltage terminal with a reference voltage and, based on the voltage at the voltage terminal being less than the reference voltage, applying a test signal to a digital logic circuit coupled to a test terminal, the digital logic circuit including at least one digital logic gate. The method further comprises monitoring a signal produced at an output of the at least one digital logic gate in response to a combination of the test signal, a delayed copy of the test signal, and a voltage at the test terminal, and based on the signal failing to transgress a threshold within a time period providing a fault signal indicating detection of a fault at the test terminal, wherein the time period is based on a combination of the test signal and the delayed copy of the test signal.

BRIEF DESCRIPTION OF THE DRA WINGS

DETAILED DESCRIPTION

Techniques are described for detecting fault conditions, such as short or open conditions associated with certain components. The techniques may be used in any number of circuits, such as in a switching voltage regulator, for example. In some embodiments, fault detection circuitry is implemented using low voltage digital logic components that are relatively inexpensive and occupy a relatively small die area (e.g., compared to components rated for high voltage, which tend to be more expensive and larger).

As described in more detail below, in some embodiments, a fault detection circuit includes a first logic gate and a second logic gate having a first input terminal coupled to a test signal terminal and an output terminal coupled to a first input terminal of the first logic gate. The fault detection circuit may further include a first sequential logic device and a voltage comparator having first and second comparator input terminals and a comparator output terminal. In some such examples, the first comparator input terminal is coupled to a test terminal and to a second input terminal of the first logic gate. The second comparator input terminal may be coupled to a reference voltage terminal, such that the comparator can be configured to compare a voltage at the test terminal with a reference voltage at the reference voltage terminal. In other examples, the first comparator input terminal is coupled to a feedback terminal and the comparator is configured to compare a voltage at the feedback terminal with the reference voltage. The comparator output terminal is coupled to an input terminal of the first sequential logic device. In some such examples, the fault detection circuit further includes a delay device coupled between the test signal terminal and a second input terminal of the second logic gate, and a digital logic circuit coupled to an output terminal of the first logic gate and having at least one fault detection output terminal. The delay device can be configured to set a time window during which a fault detection process can be carried out. As described further below, the digital logic circuit can be configured to produce a fault signal at the at least one fault detection output terminal if a fault is detected by monitoring a signal at the test terminal during the time window. Such monitoring may indicate, for instance, a high current condition, a non-compliant voltage condition, or a missing component, at the test terminal.

General Overview

A number of non-trivial issues are associated with developing a fault detection circuit and methodology. For instance, a fault detection circuit for switching voltage regulators can detect potentially damaging fault conditions at start-up of the regulator and provide effective protection for circuit components. The faults are varied in nature, with some faults stemming from a short circuit condition, and other faults stemming from an open circuit condition (such as a missing or damaged component). One possible approach might involve charging the switching terminal (positioned between the high-side and low-side transistors) to check conditions at the switching terminal by turning on the high-side power transistor. However, this approach involves significant risk of circuit damage if, for instance, the switching terminal is shorted to ground. Another possible approach might involve providing an additional test charging path. However, this may significantly increase the die size, which adds bulk and cost that may be undesirable in many applications.

Accordingly, fault detection circuits are described herein that are configured to detect various fault conditions, such as those faults that may occur at the switching terminal of a switching voltage regulator, while providing good protection for the circuitry without introducing the risk of damage and die size increase. As described in more detail below, examples of the fault detection circuits and method described herein can be configured to detect short or open conditions, such as those associated with the "boot" capacitor coupled to the switching terminal, short or open conditions associated with the inductor coupled to the switching terminal, and/or the switching terminal being shorted to ground. Thus, in some examples, multiple different fault conditions can be detected using a single fault detection circuit. In addition, examples of the fault detection circuits and methods described herein may be implemented at relatively low cost by using the existing switching terminal charging path. Further, examples of the fault detection circuitry described herein advantageously can be implemented using digital logic components that occupy relatively little die area and have relatively low current consumption as compared to other approaches.

Fault Detection Circuits and Methods

Figure 1:
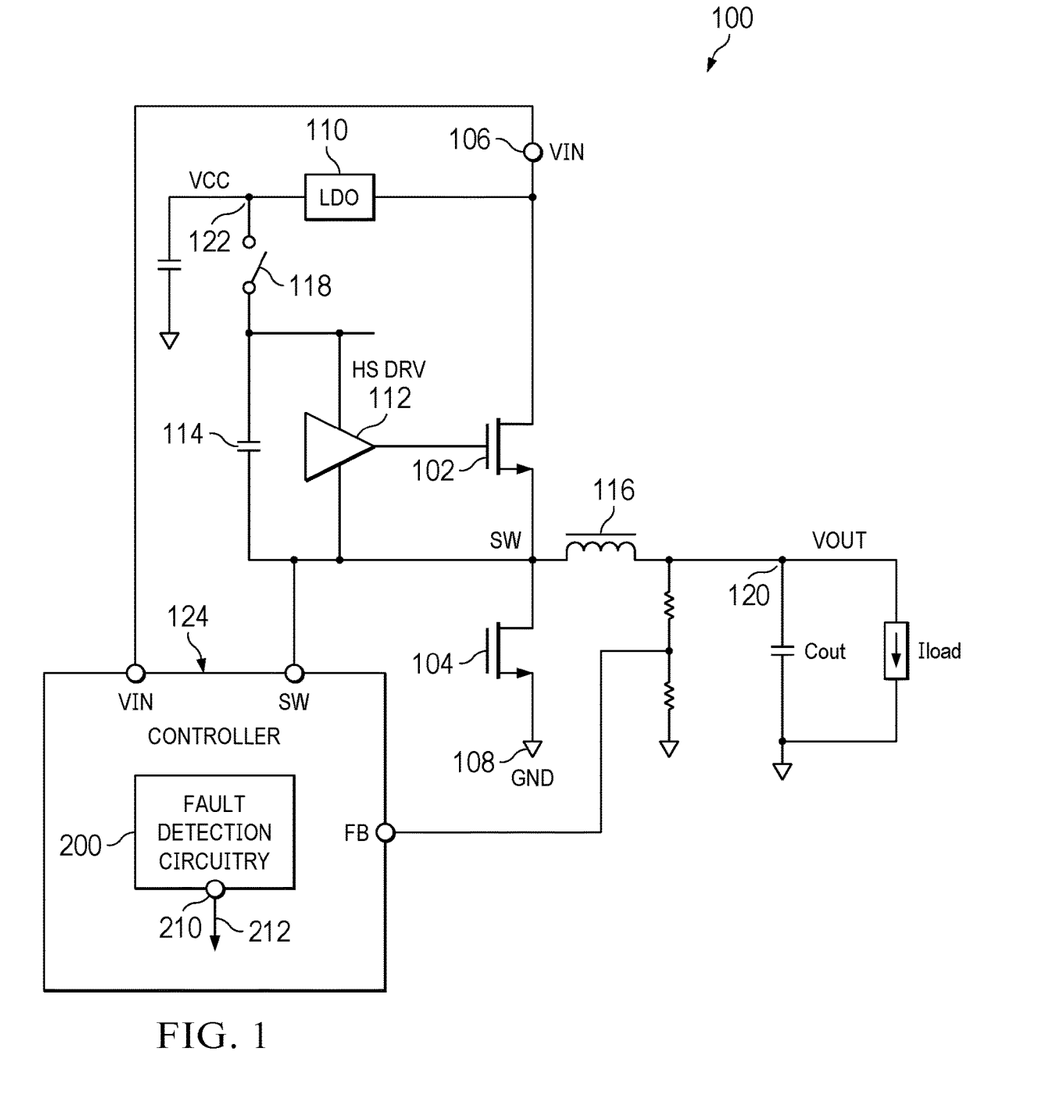
FIG. 1 is a schematic diagram of a switching voltage regulator including fault detection circuitry, in an example.

FIG. 1 illustrates a switching voltage regulator 100 including fault detection circuitry 200, in an example. The switching voltage regulator 100 includes a high-side transistor 102 and a low-side transistor 104 that are coupled in series between an input voltage terminal 106 and a ground terminal 108. An input voltage, VIN, may be applied at the input voltage terminal 106. In some examples, the high-side and low-side transistors 102, 104 are power field effect transistors (FETs). In some cases, one or both of the high-side transistor 102 and/or the low-side transistor 104 may be implemented using one or more FETs or other transistors coupled together. A test terminal, SW, which may correspond to the switching node or terminal of the switching voltage regulator, is positioned between the high-side and low-side transistors 102, 104, as shown in FIG. 1. As described in more detail below, in some examples, the fault detection circuitry 200 is configured to detect fault conditions at the test terminal SW. In some examples, the fault detection circuitry 200 is part of a controller 124 that may be configured to control switching of the high-side and low-side transistors 102, 104, optionally among other functions. In the illustrated example, the controller 124 includes a VIN terminal coupled to the input voltage terminal 106, an SW terminal coupled to the test terminal SW, and a feedback (FB) terminal coupled to the output terminal 120 via a resistive divider. Accordingly, the controller 124 receives, at the FB terminal, a signal, $V_{FB}$, that is representative of the output voltage, $V_{OUT}$. The controller 124 may include one or more other terminals and/or connection not shown in FIG. 1.

In the illustrated example, a low drop-out oscillator (LDO) 110 is coupled between the input voltage terminal 106 and a supply voltage (Vcc) terminal 122. The high-side transistor 102 is driven by a high-side driver 112 (a driver for low-side transistor 104 is not shown but may also be present). A boot capacitor 114 is connected across the high-side driver 112 between the supply voltage terminal 122 the test terminal SW. An inductor 116 is coupled between the test terminal SW and an output terminal 120 to which a load, represented in FIG. 1 by Iload, is connected. The boot capacitor 114 is coupled to the supply voltage terminal 122 via a switch 118. The boot capacitor 114 acts as a floating node providing power for the high-side driver 112. In normal regulator operation (no fault condition), a supply voltage, Vcc, provided at the terminal 122 charges the boot capacitor 114 via the switch 118 when the test terminal SW is low. The test terminal SW provides a PWM signal across the inductor 116 to supply an output voltage, $V_{OUT}$, to the load. In other examples, the switching voltage regulator 100 may include various additional components not illustrated in FIG. 1, or otherwise be configured differently.

In some circumstances, various fault conditions can occur in the switching voltage regulator 100 that could potentially damage the load and/or the voltage regulator circuitry itself. Accordingly, the fault detection circuitry 200 can be configured to detect such faults and prevent or otherwise limit operation of the switching voltage regulator until the fault condition is resolved. As described in more detail below, the fault detection circuitry 200 can be configured to detect that the boot capacitor 114 is "missing," that the inductor 116 is "missing," and/or that the test terminal is shorted to ground. As used herein, the term "missing" is intended to mean that the boot capacitor 114 and/or inductor 116 may have an open circuit condition relative to the test terminal SW or a short circuit condition relative to the test terminal SW. An open circuit condition for the boot capacitor 114 may be caused by the boot capacitor 114 actually not being present in the circuit at all, or by a faulty connection at either terminal of the boot capacitor 114, or by a fault of the capacitor 114 itself, such that it appears an open circuit condition exists between the switch 118 and the test terminal SW. Similarly, an open circuit condition for the inductor 116 may be caused by the inductor 116 actually not being present in the circuit at all, or by a faulty connection at either terminal of the inductor 116, or by a fault of the inductor 116 itself, such that it appears an open circuit condition exists between the test terminal SW and the load. In a short circuit condition of the boot capacitor 114, it may appear that the switch 118 is shorted to the test terminal SW. Similarly, in a short condition of the inductor 116, it may appear that the test terminal SW is shorted to the load (and/or to the output capacitor, $C_{out}$). In any of these open and short circuit conditions, it may appear, from the point of view of the test terminal SW, that the boot capacitor 114 and/or the inductor 116 are "missing" or otherwise in a defective state.

Thus, and as described further below, the fault detection circuitry 200 may include at least one fault detection output terminal 210 at which a fault signal 212 may be output in the event that any of the above-mentioned fault conditions are detected. In some examples, the fault detection output terminal 210 may be coupled to, or may be, another terminal of the controller 124. In other examples, the fault detection output terminal 210 is internal to the controller 124.

Figure 2:
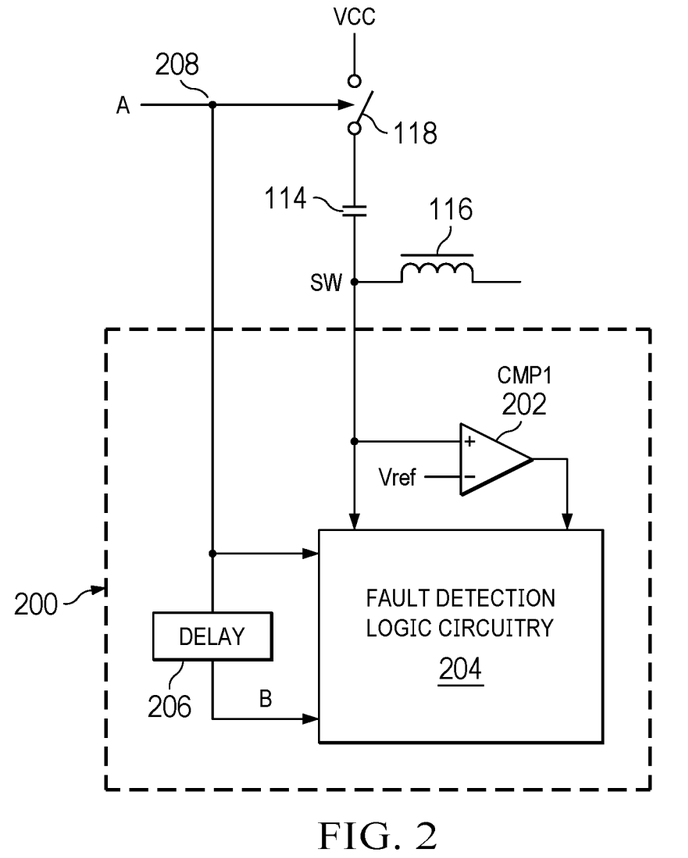
FIG. 2 is a block diagram illustrating fault detection circuitry, in an example.

Referring to FIG. 2, according to certain examples, the fault detection circuitry 200 includes a comparator 202, fault detection logic circuitry 204, and a delay element 206. In some examples, the comparator 202 is used to determine whether or not the switching voltage regulator 100 is in a prebias condition. This may be accomplished by using the comparator 202 to compare the output voltage, $V_{OUT}$, with a reference voltage, Vref, as described below. This may be accomplished in various ways. In some examples, the comparator 202 may detect the output voltage, $V_{OUT}$, via the test terminal SW. In such examples, the comparator 202 has a first comparator input coupled to the test terminal SW and a second comparator input at which the reference voltage, Vref, is received, as shown in FIG. 2. In other examples, the comparator 202 may detect the feedback voltage, $V_{FB}$, which is representative of $V_{OUT}$, as discussed above. In such examples, the first comparator input may be coupled to the FB terminal rather than to the test terminal SW, as described further below with reference to FIG. 3B. The comparator 202 further has a comparator output terminal coupled to the fault detection logic circuitry 204. Example implementations of the fault detection logic circuitry 204, and operation of the comparator 202, are described further below with references to FIGS. 3A, 3B, and 6. In some examples, a test signal, A, is applied at a test signal terminal 208 and received at an input terminal of the fault detection logic circuitry 204. The delay element 206 operates on the test signal, A, produce a delayed copy, B, of the test signal (referred to herein as the delayed signal, B), which is received at another input terminal of the fault detection logic circuitry 204, as shown. A combination of the test signal, A, and the delayed signal, B, may provide a test window during which the fault detection logic circuitry 204 monitors for fault conditions at the test terminal SW, as described further below.

Figure 3A:
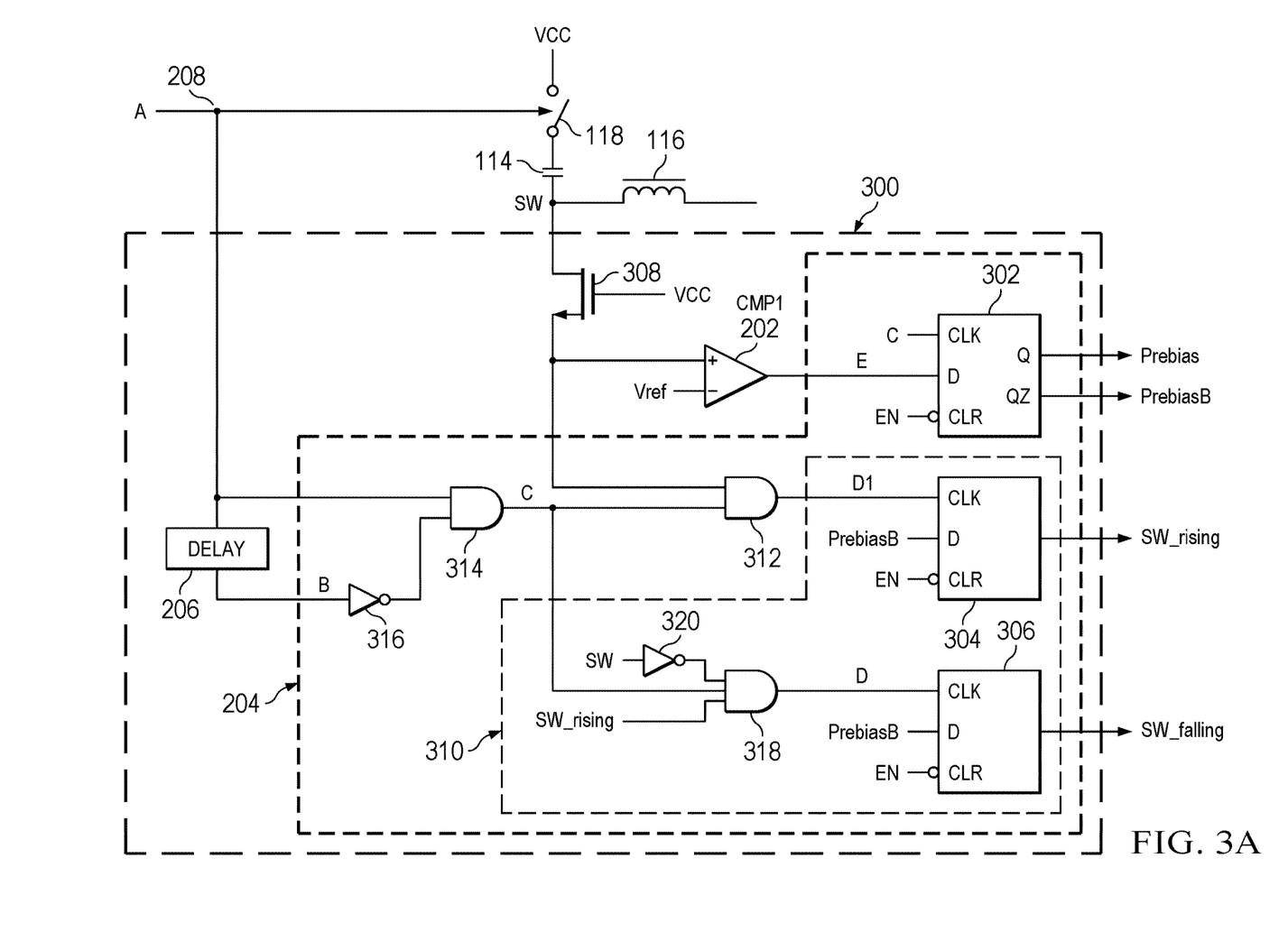
FIG. 3A is a schematic diagram illustrating fault detection circuitry, in an example.

Referring to FIG. 3A, there is illustrated an example of a fault detection circuit 300 that can be used to implement the fault detection circuitry 200 in some embodiments. In this example, the fault detection logic circuitry 204 includes a first sequential logic device 302, a digital logic circuit 310, and first and second logic gates 312, 314. The digital logic circuit 310 includes second and third sequential logic devices 304, 306, and a third logic gate 318. In certain examples, the digital logic circuit 310 operates as an edge detection circuit, as described further below. In some examples, the first, second, and third sequential logic devices 302, 304, 306 are digital latches.

In some examples, the switching voltage regulator 100 is a relatively high voltage device, and therefore, an input voltage, Vcc, used to charge the boot capacitor 114 and applied to the high-side driver 112 (see FIG. 1) may be higher (e.g., 12V, 24V, etc.) than a suitable operating voltage range (e.g., 3V-5V) for the fault detection logic circuitry 204. Accordingly, the fault detection circuit 300 may include a transistor 308 coupled between the test terminal SW and the fault detection logic circuitry 204 to protect the lower voltage fault detection logic circuitry 204. In some examples, the transistor 308 is a high voltage NMOS device.

As shown in FIG. 3A, a comparator output terminal of the comparator 202 is coupled to the first sequential logic device 302. The first sequential logic device 302 further receives as inputs an enable signal, EN, and a window signal C. The first sequential logic device 302 produces a pair of complementary output signals, Prebias and PrebiasB.

The window signal, C, may be produced from a combination of the test signal, A, and the delayed signal, B. In the example of FIG. 3A, the first logic gate 312 has a first input terminal coupled to the test terminal SW and a second input terminal coupled to the output of the second logic gate 314. The output of the first logic gate 312 is coupled to the second sequential logic device 304. In one example, the first logic gate 312 is a digital AND gate. The second logic gate has a first input terminal coupled to the test signal terminal 208 to receive the test signal, A, and a second input terminal coupled to the delay device 206 to receive the delayed signal, B. In some examples, an inverter 316 is coupled between the delay device 206 and the corresponding input terminal of the second logic gate 316, as shown in FIG. 3A. In one example, the second logic gate 314 is digital AND gate. The second logic gate 314 produces, at its output, the window signal, C, from a combination of the test signal, A, and the delayed signal, B.

According to certain examples, the third logic gate is a three-input digital AND gate having a first input coupled to the test terminal SW, a second input coupled to the output of the second logic gate 314 (to receive the window signal, C), and a third input coupled to an output terminal of the second sequential logic device 304. In some examples, an inverter 320 is coupled between the test terminal SW and the corresponding input terminal of the third logic gate 318. The third logic gate 318 further has an output terminal coupled to the third sequential logic device 306.

Figure 4:
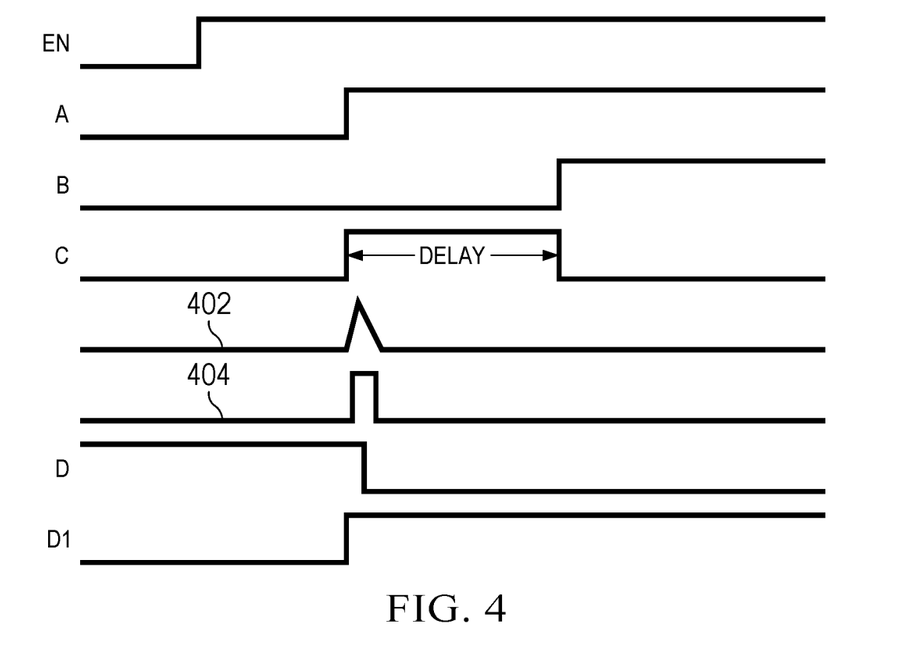
FIG. 4 is a timing diagram showing examples of various signals in the circuitry of FIGS. 2 and 3, in an example.

Each of the sequential logic devices 302, 304, 306 has an enable terminal at which an enable signal, EN, is received to enable operation of the fault detection circuit 300. FIG. 4 is a timing diagram illustrating an example of various signals applied and produced during a fault detection process using the fault detection circuit 300. Operation of the fault detection circuit 300 is described below with continuing reference to FIGS. 3A and 4.

As shown in FIG. 4, in one example, before a start of the fault detection process, the enable signal EN is low (0), clearing all three sequential logic devices 302, 304, 306. When the enable signal EN transitions to high (1), the fault detection process may start. The circuitry described herein may be modified to operate based on the opposite binary logic condition to that described. For example, all instances of an operation causing or resulting from a signal transitioning from low (0) to high (1), or vice versa, may instead be configured to cause or result from the signal transitioning from high (1) to low (0), or vice versa. Thus, while the following examples, for clarity, are described with reference to certain signals being low or high, in other examples, the opposite binary condition may be used instead.

Figure 3B:
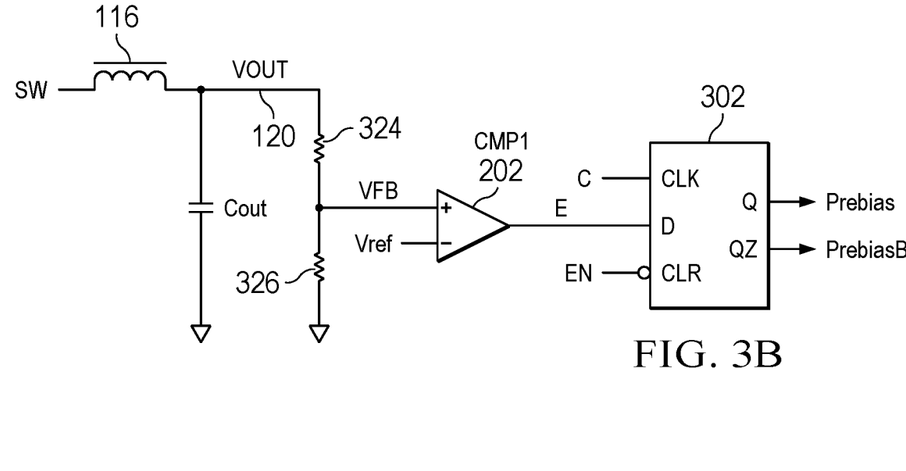
FIG. 3B is a schematic diagram illustrating a portion of the fault detection circuitry, in another example.

In an example, after the enable signal EN goes high, the comparator 202 compares the output voltage, $V_{OUT}$, with the reference voltage, Vref. In the example shown in FIG. 3A, the output voltage, $V_{OUT}$, is detected via the test terminal SW. Accordingly, the comparator 202 has one comparator input terminal coupled to the test terminal SW, as shown in FIGS. 2 and 3A. FIG. 3B illustrates an alternate example in which the output voltage, $V_{OUT}$, may be measured by detecting the feedback voltage, $V_{FB}$. In this example, the comparator 202 has one comparator input terminal coupled to the output terminal 120 via a voltage divider. The voltage divider comprises first and second resistors 324, 326 coupled in series between the output terminal 120 and ground. The comparator input terminal is coupled to a junction between the two resistors 324, 326, as shown in FIG. 3B, which may correspond to the FB terminal of the controller 124, as described above with reference to FIG. 1. In both cases, the second comparator input terminal receives the reference voltage, Vref, and the comparator output terminal is coupled to an input of the first sequential logic device 302, as shown in FIGS. 2, 3A, and 3B. In some examples, if the output voltage, $V_{OUT}$, is higher than the reference voltage, Vref, then the switching voltage regulator 100 is in the prebias condition. Necessarily, in this case, the test terminal SW is not shorted to ground. Further, in order for the switching voltage regulator 100 to achieve the prebias condition, it may be that the boot capacitor 114 and the inductor 116 are both present and properly connected in the circuit. Therefore, according to certain examples, if the output of the comparator 202 indicates that the switching voltage regulator 100 is in the prebias condition, further fault detection may not be performed. The Prebias signal output by the first sequential logic device 302 is set high, while the complementary signal, PrebiasB, is set low. On the other hand, if the output voltage, $V_{OUT}$, is less than the reference voltage, Vref, the Prebias signal output from the first sequential logic device 302 may remain low (while the PrebiasB signal remains high), and a process is implemented to test for fault conditions associated with the test terminal SW, such as the boot capacitor 114 and/or inductor 116 being missing, and/or the test terminal SW being shorted to ground.

In one example, to perform fault detection, the test signal, A, applied to the test signal terminal 208 goes high to close the switch 118 and begin charging the boot capacitor 114 without turning on the low-side transistor 104. The boot capacitor 114 may be charged via a path from the supply voltage, Vcc, through the switch 118 and the inductor 116 to the output terminal 120 (see FIG. 1). After a delay period set by the delay device 206, the delayed signal, B, also goes high. Since the signals A and B are applied to the input terminals of the second logic device 314, the second logic device outputs the window signal, C, which in this example, is high for the delay period, as shown in FIG. 4. In one example, the length of the delay period is selected to be longer than the full charging time of the boot capacitor 114 over a range of combinations of values (capacitance and inductance, respectively) of the boot capacitor 114 and the inductor 116.

Referring to FIG. 4, if there is no fault condition associated with the boot capacitor 114, a pulse signal 402 will be present at the test terminal SW corresponding to charging and subsequent discharging of the boot capacitor 114. Signal 404 represents a digitized version of the pulse signal 402. As described above, in some examples, the digital logic circuit 310 operates as an edge detection circuit configured to detect the rising edge and the falling edge of the signal 404. In the case of no fault condition, both the rising edge and the falling edge of the signal 404 can be detected within the delay time. Failure to detect the rising edge and/or falling edge indicates a fault.

Referring again to FIG. 3A, in some examples, the second sequential logic device 304 is configured to detect the rising edge of the signal 404 at the test terminal SW. The second sequential logic device 304 is enabled for the fault detection process by the enable signal, EN, and the PrebiasB signal both being high, as described above. The second sequential logic device receives at a clock input, the signal, D1, output from the first logic gate 312. The signal, D1, is produced by an AND operation performed on the signal 404 at the test terminal SW and the window signal C. Thus, if there is no fault condition at the test terminal SW or at the boot capacitor 114, the signal D1 will go high following the rising edge of the signal 404. In response, a signal SW_rising output the second sequential logic device goes high, indicating that the rising edge of the signal 404 at the test terminal SW has been detected.

If the test terminal SW is shorted to ground, the boot capacitor 114 will not charge, no pulse signal 402/404 will be present at the test terminal, and therefore no rising edge will be detected. Accordingly, the signal SW_rising output from the second sequential logic device 304 is low, indicating a fault. Similarly, if the boot capacitor is missing (e.g., has either a short or an open condition), the pulse signal 402/404 will not be present at the test terminal SW and no rising edge will be detected. Thus, in this condition, the signal SW_rising output from the second sequential logic device 304 is again low, indicating a fault. Similarly, the inductor 116 has a short circuit condition, there will be no rising edge detected (no pulse signal 402/404 at the test terminal), and the SW_rising signal will be low, indicating a fault. In any of these conditions, since the SW_rising signal input to the third logic device 318 is low, there will be no transition in the signal, D, output from the third logic gate 318, and a signal SW_falling output from the third sequential logic device 306 will also remain low (indicating a fault).

The third sequential logic device 306 is enabled for fault detection by the enable signal, EN, and the PrebiasB signal both being high, as described above. If the rising edge is detected, the third logic gate 318 "monitors" for a transition (the falling edge) in the pulse signal 402/404 at the test terminal SW. If the falling edge is present, the signal, D, may transition from high to low (as shown in FIG. 4), causing the signal SW_falling output by the third sequential logic device 306 to go high, indicating that the falling edge has been detected. If the inductor 116 has an open condition (or is absent from the circuit), there will be no falling edge following the rising edge of the signal 402/404. Accordingly, the signal SW_falling output by the third sequential logic device 306 remains low, indicating a fault condition.

Figure 5:
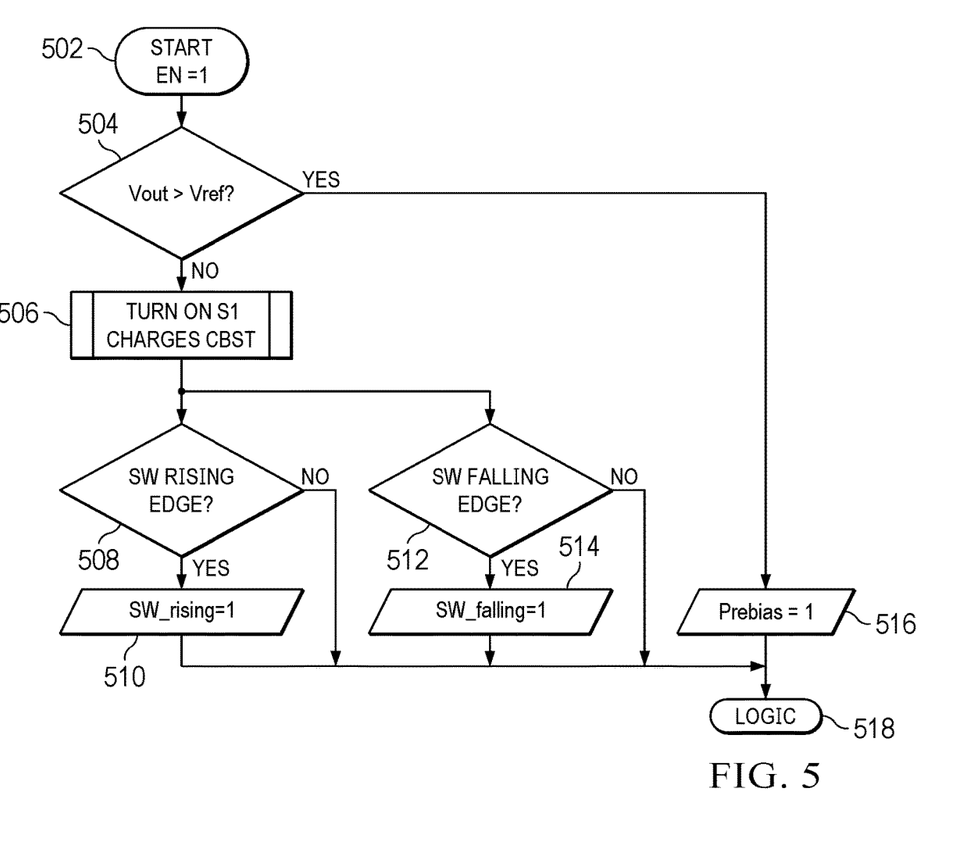
FIG. 5 is a flow chart for a method of fault detection using the circuitry of FIGS. 2 and 3, in an example.

Referring to FIG. 5, there is illustrated a flow diagram for an example of a fault detection methodology that can be implemented using the fault detection circuit 300 described above.

At operation 502, the enable signal, EN, applied to the sequential logic devices 302, 304, and 306 is set high.

At operation 504, the comparator 202 may be used to compare the output voltage, $V_{OUT}$, (or a voltage representative of the output voltage, such as $V_{FB}$, for example) with the reference voltage, Vref, as described above with reference to FIGS. 3A and 3B.

If the output voltage, $V_{OUT}$, (or its representative) does not exceed the reference voltage, Vref, the system proceeds to operation 506. At operation 506, the test signal, A, is applied to turn on the switch 118 and attempt to charge the boot capacitor 114.

At operation 508, the circuit monitors for a rising edge corresponding to the presence of the pulse signal 402/404 at the test terminal SW. If the rising edge is detected, at operation 510, the signal, SW_rising, output from the second sequential logic device 304 is set high. Similarly, at operation 512, the circuit monitors for a falling edge of the pulse signal 402/404 at the test terminal SW. If the falling edge is detected, at operation 514, the signal, SW_falling, output from the third sequential logic device 306 is set high.

Returning to operation 504, if the voltage at the test terminal SW exceeds the reference voltage, Vref, it can be determined that the switching voltage regulator 100 is in the prebias condition. Accordingly, at operation 516, the signal Prebias output by the first sequential logic device 302 can be set high, indicating that no fault condition is present. In various applications, the switching voltage regulator 100 may not enter or be in a prebias condition, and therefore, the process may routinely proceed through operations 506 to 514. The lack of a prebias condition may not necessarily indicate the presence or likelihood of a fault. However, if the circuit is in a prebias condition, it may be determined that no fault condition exists at the test terminal SW.

At operation 518, various logic processing actions may be performed, depending on the state (low or high) of the signals Prebias, SW_rising, and SW_falling. For example, if the prebias signal is high, or if both the SW_rising and SW_falling signals are high, indicating that no fault condition has been detected, the switching voltage regulator may proceed to start-up under normal operating conditions. Alternatively, if either the SW_rising or SW_falling signals are low, indicating that a fault condition has been detected, the fault detection circuit 200 may provide the fault signal 212 at the at least one fault detection output terminal 210, and may prevent the switching voltage regulator from proceeding to start-up (and thereby protecting the circuitry and/or the load from possible damage due to the fault). As described above, by monitoring both the rising and falling edges of the pulse signal 402/404 at the test terminal SW, the fault detection circuit 300 may differentiate between different types of fault conditions (e.g., an open condition at the inductor 116 vs a short/open condition at the boot capacitor 114 or short condition at the inductor 116). Accordingly, in some examples, the fault signal 212 may identify the type of fault condition detected.

Figure 6:
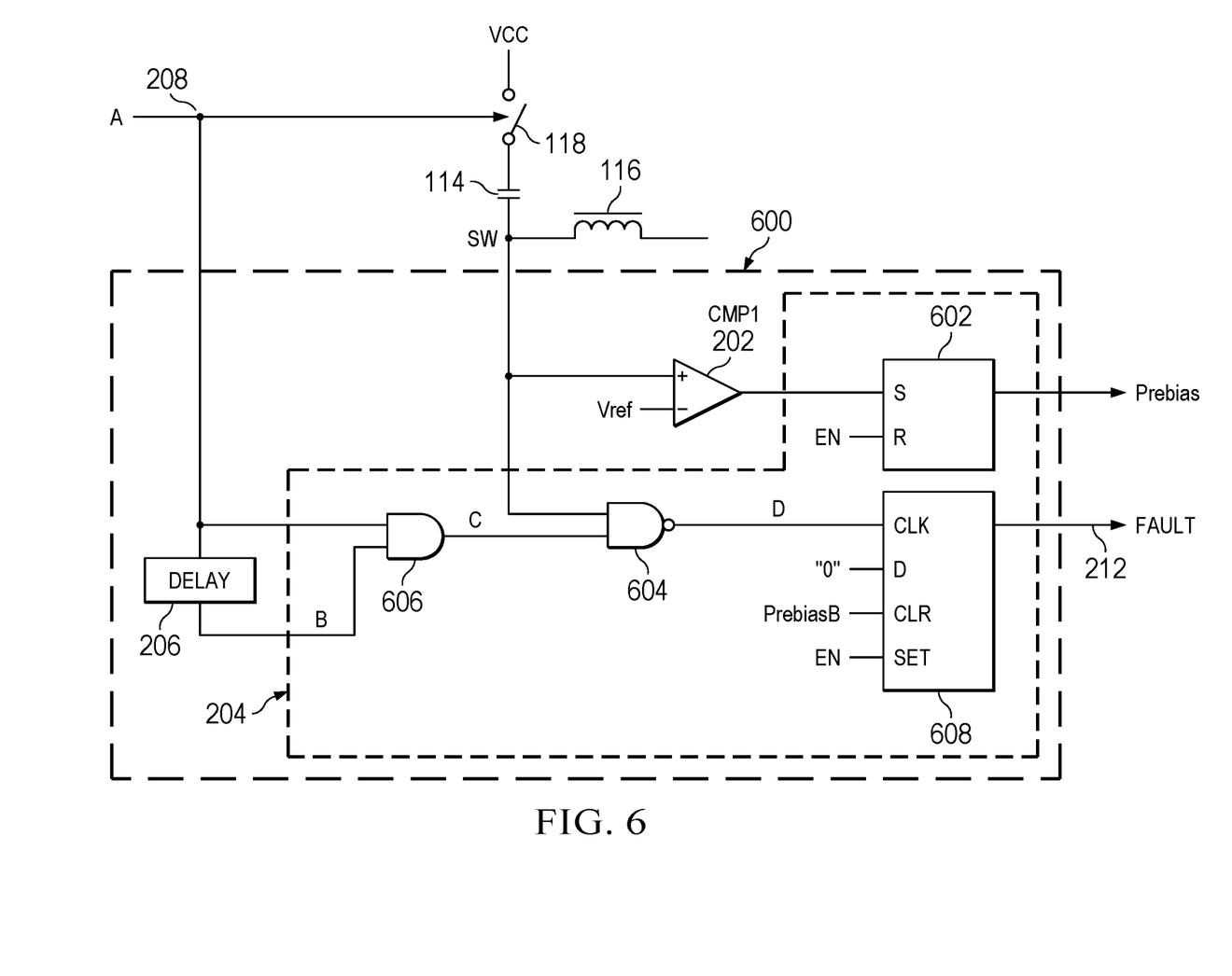
FIG. 6 is a schematic diagram illustrating fault detection circuitry, in another example.

Referring now to FIG. 6, there is illustrated another example of a fault detection circuit 600 that may be used to implement the fault detection circuitry 200 according to certain embodiments. In this example, the fault detection logic circuitry 204 includes a first sequential logic device 602, a first logic gate 604, a second logic gate 606, and a second sequential logic device 608. The first and second sequential logic devices may be digital latches, for example.

Figure 7:
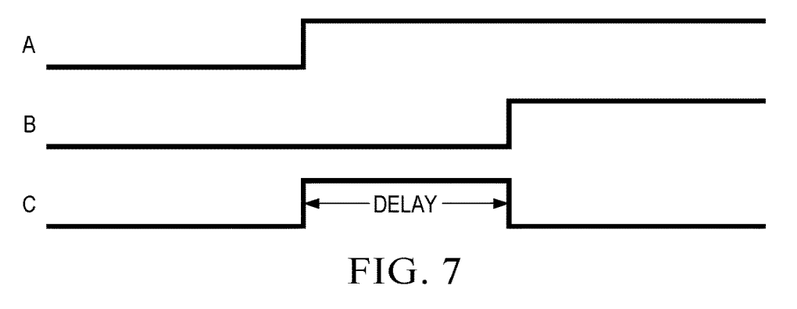
FIG. 7 is a timing diagram showing examples of various signals in the circuitry of FIGS. 2 and 6, in another example.

In one example, the second logic gate 606 receives at its inputs, the test signal, A, and the delayed signal, B, and produces at its output terminal, the window signal, C, as described above. FIG. 7 is a timing diagram illustrating an example of various signals applied and produced during a fault detection process using the fault detection circuit 600. As shown in FIG. 7, and as described above with reference to FIGS. 3 and 4, the window signal, C, is high for a time period corresponding to the delay time set by the delay device 206.

In the example of FIG. 6, the output of the second logic gate 606 is coupled to one input terminal of the first logic gate 604, and the other input terminal of the first logic gate 604 is coupled to the test terminal SW. The output terminal of the first logic gate 604 is coupled to a clock input terminal of the second sequential logic device 608. The first and second logic gates 604, 606 may be digital AND or digital NAND gates, for example.

As described above, in certain examples, a fault detection process can be begun in response to the enable signal, EN, going high to enable or reset the first and second sequential logic devices 602, 608. In certain examples, a fault signal 212 output by the second sequential logic device 608 can be set to a high (1) default state, such that the switching voltage regulator 100 is prevented from starting up until the fault condition is cleared by the fault detection circuit 600. In this manner, the circuitry and/or the load (see FIG. 1) can be protected in the event of fault condition being present.

As described above, the comparator 202 can be used to determine whether or not the switching voltage regulator 100 is in the prebias condition by comparing the output voltage, $V_{OUT}$, with the reference voltage, Vref. In the example of FIG. 6, the comparator 202 is shown connected so as to detect the output voltage, $V_{OUT}$, via the test terminal SW, as described above with reference to FIGS. 2 and 3A. However, in other examples, the comparator 202 can be connected so as to detect the feedback voltage, $V_{FB}$, representative of the output voltage, as described above with reference to FIG. 3B. In this case, one comparator input terminal is coupled to the output terminal 120 via resistor 324, as shown in FIG. 3B, while the other comparator input terminal remains coupled to the reference terminal to receive the reference voltage, Vref, and the comparator output terminal remains coupled to an input terminal of the first sequential logic device 602, as shown in FIG. 6. If the output voltage, $V_{OUT}$, (or the feedback voltage, $V_{FB}$) exceeds the reference voltage, Vref, a signal, Prebias, output from the first sequential logic device 602 may be set high, indicating that the switching voltage regulator 100 is in the prebias condition. As shown in FIG. 6, in one example, the Prebias signal is provided at an input terminal of the second sequential logic device 608. As described above, if the switching voltage regulator 100 is in the prebias condition, it can be determined that a fault condition is not present at the test terminal SW. Accordingly, setting the Prebias signal high may clear the fault indication at the second sequential logic device 608, such that the fault signal 212 goes low (0), indicating that no fault has been detected. On the other hand, if the output voltage, $V_{OUT}$, (or the feedback voltage, $V_{FB}$) does not exceed the reference voltage, Vref, the Prebias signal may remain low.

During the testing time period set by the delay device 206 (and the window signal, C), the first logic gate 604 and the second sequential logic device 608 may monitor a signal at the test terminal SW to determine whether or not the boot capacitor 114 or the inductor 116 are missing or the test terminal SW is shorted to ground. As described above, the test signal, A, applied at the test signal terminal 208 can transition high, closing the switch 118 and charging the boot capacitor 114, without turning on the low-side transistor 104 (see FIG. 1). As described above, if the boot capacitor 114 and inductor 116 are properly connected (no short or open) and the test terminal SW is not shorted to ground, then a pulse signal (e.g., 402/404) will be present at the test terminal SW during the time period corresponding to the delay time shown in FIG. 4. On the contrary, if the boot capacitor 114 is missing, or if the test terminal SW is shorted to ground, then no pulse will be present at the test terminal SW during the time period. Further, if the inductor 116 is missing, the boot capacitor 114 will charge, but the voltage at the test terminal will continue to rise and/or remain high for an extended time, and there will be no falling edge of the expected pulse within the time period.

Accordingly, in certain examples, the fault detection circuit 600 monitors for the falling edge at the test terminal SW during the time period, and uses detection of the falling edge to clear (reset) the fault condition. Thus, if the expected pulse is present at the test terminal, the falling edge causes a transition in the signal, D, output from the first logic gate 604. Since the signal, D, is applied to the clock input terminal of the second sequential logic device 608, a transition in the signal, D, causes the second sequential logic device 608 to reset, sending the fault signal 212 low to indicate that no fault has been detected.

Figure 8:
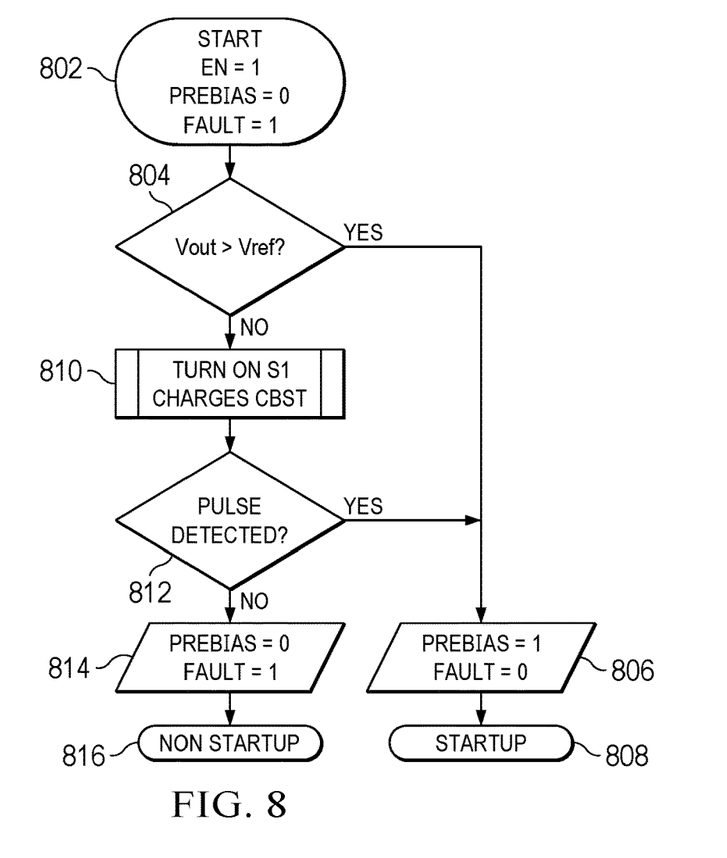
FIG. 8 is a flow chart for a method of fault detection using the circuitry of FIGS. 2 and 6, in another example.

FIG. 8 illustrates a flow diagram for an example of a fault detection methodology that can be implemented using the fault detection circuit 600 described above.

At operation 802, the enable signal, EN, applied to the sequential logic devices 602 and 608 is set high. As described above, in certain examples, the Prebias signal can be set to a low (0) default value and the fault signal 212 can be set to a high (1) default value to prevent operation of the switching voltage regulator 100 until it is confirmed that no fault condition is present.

At operation 804, the comparator 202 may be used to compare the output voltage, $V_{OUT}$, (or a voltage representative of the output voltage, such as the feedback voltage, $V_{FB}$, for example) with the reference voltage, Vref, as described above.

If the output voltage, $V_{OUT}$, (or its representative) exceeds the reference voltage, Vref, it can be determined that the switching voltage regulator 100 is in the prebias condition, and therefore that no fault condition is present. Accordingly, at operation 806, the Prebias signal can be set high, and the fault signal 212 can be set low. Then at operation 808, the switching voltage regulator 100 may start-up and begin normal operation.

If the output voltage, $V_{OUT}$, (or its representative) does not exceed the reference voltage, Vref, the fault detection circuit 600 may be used to check whether a fault condition may be present. At operation 810, the test signal, A, is applied to turn on the switch 118 and attempt to charge the boot capacitor 114, as described above.

At operation 812, the fault detection circuit 600 may determine whether or not the expected pulse signal is present at the test terminal SW. As described above, in one example, if the expected pulse is present at the test terminal SW within the delay time period, the falling edge of the pulse causes a transition in the signal, D, output from the first logic gate 604. This transition can be used to clear the default fault condition (e.g., to cause the fault signal 212 to transition low). Accordingly, if the falling edge of the pulse (or transition in the signal, D) is detected at operation 812, the system may proceed to operations 806 and 808 described above. In certain examples, following detection of the pulse at operation 812, the fault signal 212 may be set low, and the system may proceed to operation 808 without necessarily setting the Prebias signal high.

At operation 812, if the falling edge of the expected pulse signal at the test terminal SW (or corresponding transition in the signal, D) is not detected, this may indicate the presence of a fault. Accordingly, at operation 814, the fault signal 212 remains high, indicating a fault, and at operation 816, the switching voltage regulator 100 is prevented from starting up. The fault signal 212 may be provided at the at least one fault detection output terminal 210 to indicate to a user or other circuitry that a fault condition has been detected. In some examples, at operation 814, the Prebias signal also remains in the default state (e.g., low).

Thus, aspects and embodiments provide fault detection circuits and methodologies that can be applied to detect any of several potential fault conditions that may occur in a switching voltage regulator or other circuit.

FURTHER EXAMPLES

Example 1 is a fault detection circuit comprising a first logic gate having a first input terminal coupled to a test terminal, a second logic gate having an input terminal coupled to a test signal terminal and an output terminal coupled to a second input terminal of the first logic gate, a first sequential logic device, a voltage comparator having first and second comparator input terminals and a comparator output terminal, the first comparator input terminal coupled to a voltage terminal, the second comparator input terminal coupled to a reference voltage terminal, and the comparator output terminal coupled to an input terminal of the first sequential logic device, a delay device coupled between the test signal terminal and a first input terminal of the second logic gate, and a digital logic circuit coupled to an output terminal of the first logic gate and having at least one fault detection output terminal.

Example 2 includes the fault detection circuit of Example 1, wherein the digital logic circuit includes a second sequential logic device having a clock terminal coupled to the output terminal of the first logic gate and an input terminal coupled to an output terminal of the first sequential logic device.

Example 3 includes the fault detection circuit of Example 2, wherein the digital logic circuit further comprises a third logic gate having a first input terminal coupled to the output terminal of the second logic gate, a second input terminal coupled to a fault terminal of the second sequential logic device, and a third input terminal coupled to the test terminal, and a third sequential logic device having a clock terminal coupled to an output terminal of the third logic gate and an input terminal coupled to the output terminal of the first sequential logic device.

Example 4 includes the fault detection circuit of Example 3, wherein the first, second, and third sequential logic devices are digital latches.

Example 5 includes the fault detection circuit of any one of Examples 1-4, wherein the first and second logic gates are AND gates.

Example 6 includes the fault detection circuit of Example 5, further comprising an inverter coupled between the delay device and the first input terminal of the second logic gate.

Example 7 includes the fault detection circuit of any one of Examples 1-6, wherein the voltage terminal is coupled to the test terminal, and wherein voltage comparator is configured to compare a test voltage at the test terminal to a reference voltage at the reference voltage terminal, and wherein, based on the test voltage being less than the reference voltage, the digital logic circuit is configured to monitor a first test signal produced at the output terminal of the first logic gate in response to a second test signal applied to the test signal terminal. The digital logic circuit is further configured to produce, at the at least one fault detection output terminal, a fault signal based on a failure of the first test signal to transgress a threshold value within a time period, the fault signal being indicative of a fault condition at the test terminal.

Example 8 includes the fault detection circuit of any one of Examples 1-6, wherein the voltage terminal is coupled to a regulator output voltage feedback terminal, wherein the voltage comparator is configured to compare a test voltage at the voltage terminal to a reference voltage at the reference voltage terminal, and wherein, based on the test voltage being less than the reference voltage, the digital logic circuit is configured to monitor a first test signal produced at the output terminal of the first logic gate in response to a second test signal applied to the test signal terminal, the digital logic circuit being further configured to produce, at the at least one fault detection output terminal, a fault signal based on a failure of the first test signal to transgress a threshold value within a time period, the fault signal being indicative of a fault condition at the test terminal.

Example 9 includes the fault detection circuit of any one of Examples 1-6, wherein the voltage terminal is coupled to one of: (i) a switching voltage terminal to receive a switching voltage of a power converter; or (ii) an output voltage feedback terminal to receive a feedback voltage representative of an output voltage of the power converter, wherein the voltage comparator is configured to compare a test voltage at the voltage terminal to a reference voltage at the reference voltage terminal, and wherein, based on the comparison of the test voltage to the reference voltage, the digital logic circuit is configured to monitor a first test signal produced at the output terminal of the first logic gate in response to a second test signal applied to the test signal terminal, the digital logic circuit being further configured to produce, at the at least one fault detection output terminal, a fault signal based on a failure of the first test signal to transgress a threshold value within a time period, the fault signal being indicative of a fault condition at the test terminal.

Example 10 includes the fault detection circuit of any one of Examples 7-9, wherein the fault condition comprises at least one of an absence of a capacitor coupled to the test terminal, an absence of an inductor coupled to test terminal, or a short circuit condition at the test terminal.

Example 11 includes the fault detection circuit of any one of Examples 1-10, further comprising a transistor coupled between the test terminal and the first input terminal of the first logic gate.

Example 12 is a fault detection circuit for detecting a fault condition in a switching voltage regulator. In this example, the fault detection circuit comprises a voltage comparator having first and second comparator input terminals and a comparator output, the first comparator input terminal coupled to a test terminal, and the second comparator input terminal coupled to a reference voltage terminal, a digital logic circuitry coupled to the test terminal, a test signal terminal, and the comparator output terminal, and a delay device coupled between the test signal terminal and the digital logic circuitry, the delay device configured to produce a delayed copy of a test signal applied at the test signal terminal, wherein the digital logic circuitry is configured to produce a monitor signal based on a combination of the test signal, the delayed copy of the test signal, and a test voltage at the test terminal, and to produce a fault signal indicative of the fault condition based on a failure of the monitor signal to transgress a threshold value within a time period.

Example 13 includes the fault detection circuit of Example 12, wherein the digital logic circuitry comprises a first logic gate having a first input coupled to the test terminal, a second logic gate having a first input terminal coupled to the test signal terminal, a second input terminal coupled to the delay device, and an output terminal coupled to a second input terminal of the first logic gate, and a first sequential logic device having an input terminal coupled to the comparator output terminal.

Example 14 includes the fault detection circuit of Example 13, wherein the digital logic circuitry further comprises a second sequential logic device having a clock terminal coupled to an output terminal of the first logic gate and an input terminal coupled to an output terminal of the first sequential logic device.

Example 15 includes the fault detection circuit of Example 14, wherein the digital logic circuitry further comprises a third logic gate having a first input terminal coupled to the output terminal of the second logic gate, a second input terminal coupled to a fault terminal of the second sequential logic device, and a third input terminal coupled to the test terminal, and a third sequential logic device having a clock terminal coupled to an output terminal of the third logic gate and an input terminal coupled to the output terminal of the first sequential logic device.

Example 16 includes the fault detection circuit of any one of Examples 13-15, wherein the first and second logic gates are AND gates.

Example 17 includes the fault detection circuit of any one of Examples 12-16, wherein the fault condition comprises at least one of absence of a capacitor coupled between the switch and the test terminal, absence of an inductor coupled between the test terminal and a regulator output terminal of the switching voltage regulator, or a short circuit condition at the test terminal.

Example 18 includes the fault detection circuit of any one of Examples 12-17, wherein the second comparator input terminal is coupled to the test terminal; wherein the voltage comparator is configured to compare a test voltage at the test terminal to a reference voltage at the reference voltage terminal; and wherein the fault detection circuit is configured to apply the test signal to actuate the switch based on the test voltage being less than the reference voltage.

Example 19 is a switching voltage regular including the fault detection circuit of any one of Examples 12-18.

Example 20 is a switching voltage regulator comprising a regulator output terminal, a first power transistor coupled between a first input voltage terminal and the test terminal, a second power transistor coupled in series with the first power transistor between the test terminal and a reference terminal, a switch coupled between a second input voltage terminal and the test terminal, and the fault detection circuit of any one of Examples 12-17.

Example 21 includes the switching voltage regulator of Example 20, wherein the second comparator input terminal is coupled to the regulator output terminal, wherein the voltage comparator is configured to compare an output voltage at the regulator output terminal to a reference voltage at the reference voltage terminal, and wherein the fault detection circuit is configured to apply the test signal to actuate the switch based on the output voltage being less than the reference voltage.

Example 22 is a fault detection circuit comprising a comparator configured to compare a voltage at a voltage terminal with a reference voltage, a digital logic circuit coupled to a test terminal and configured to receive, responsive to the voltage at the voltage terminal being less than the reference voltage as indicated by the comparator, a test signal, the digital logic circuit including at least one digital logic gate, and an edge detection circuit configured to (a) monitor a signal produced at an output of the at least one digital logic gate, and (b) based on the signal failing to transgress a threshold within a time period, providing a fault signal indicating detection of a fault at the test terminal.

Example 23 includes the fault detection circuit of Example 22, further comprising a delay device configured to produce a delayed copy of the test signal, wherein the time period is based on a combination of the test signal and the delayed copy of the test signal.

Example 24 includes the fault detection circuit of Example 23, wherein the at least one digital logic gate includes a first digital logic gate and a second digital logic gate, the second digital logic gate having a first input terminal coupled to the test terminal and a second input terminal coupled to an output terminal of the first digital logic gate, wherein the first digital logic gate is configured to produce, at the output terminal of the first digital logic gate, a window signal indicating the time period, the window signal being based on a combination of the test signal and the delayed copy of the test signal, and wherein the second digital logic gate is configured to produce the signal based on a combination of the test signal and the window signal.

Example 25 includes the fault detection circuit of Example 24, wherein the edge detection circuit comprises a sequential logic device having an input terminal coupled to an output terminal of the second digital logic gate and configured to provide the fault signal at an output terminal of the sequential logic device.

Example 26 includes the fault detection circuit of any one of Examples 22-25, wherein the voltage terminal is coupled to one of: (i) the test terminal; or (ii) an output voltage feedback terminal to receive a feedback voltage representative of an output voltage of a power converter.

Example 27 includes the fault detection circuit of any one of Examples 22-26, wherein the fault condition comprises at least one of an absence of a capacitor coupled to the test terminal, an absence of an inductor coupled to the test terminal, or a short circuit condition at the test terminal.

Example 28 is a fault detection method comprising comparing a voltage at a voltage terminal with a reference voltage, and based on the voltage at the voltage terminal being less than the reference voltage, applying a test signal to a digital logic circuit coupled to a test terminal, the digital logic circuit including at least one digital logic gate. The method further comprises monitoring a signal produced at an output of the at least one digital logic gate in response to a combination of the test signal, a delayed copy of the test signal, and a voltage at the test terminal, and based on the signal failing to transgress a threshold within a time period providing a fault signal indicating detection of a fault at the test terminal, wherein the time period is based on a combination of the test signal and the delayed copy of the test signal.

Example 29 include the fault detection method of Example 28, wherein the at least one digital logic gate includes a first digital logic gate and a second digital logic gate, the second digital logic gate having a first input terminal coupled to the test terminal and a second input terminal coupled to an output terminal of the first digital logic gate, wherein applying the test signal includes providing the test signal at a first input terminal of the first digital logic gate and providing the delayed copy of the test signal at a second input terminal of the first digital logic gate, and wherein producing the signal includes producing the signal at an output terminal of the second digital logic gate.

Example 30 includes the fault detection method of Example 29, wherein providing the fault signal includes providing the fault signal at an output terminal of a sequential logic device coupled to the output terminal of the second digital logic gate.

Example 31 includes the fault detection method of any one of Examples 28-30, wherein the fault condition comprises at least one of an absence of a capacitor coupled to the test terminal, an absence of an inductor coupled between the test terminal and the regulator output terminal, or a short circuit condition at the test terminal.

Example 32 includes the fault detection method of any one of Examples 28-31, wherein the voltage terminal is coupled to a regulator output voltage feedback terminal, and wherein comparing the voltage at the voltage terminal with the reference voltage includes comparing a feedback voltage representative of an output voltage of a power converter with the reference voltage.

Example 33 includes the fault detection method of any one of Examples 28-31, wherein comparing the voltage at the voltage terminal with the reference voltage includes comparing a voltage representative of an output voltage of a switching voltage regulator with the reference voltage.

Example 34 is a fault detection circuit configured to implement the fault detection method of any one of Examples 28-33.

Example 35 is a switching voltage regulator including fault detection circuitry configured to implement the fault detection method of any one of Examples 28-33.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs). Moreover, reference to transistor features such as gate, source, or drain is not intended to exclude any suitable transistor technologies. For instance, features such as source, drain, and gate are typically used to refer to a FET, while emitter, collector, and base are typically used to refer to a BJT. Such features may be used interchangeably herein. For instance, reference to the gate of a transistor may refer to either the gate of a FET or the base of a BJT, and vice-versa. In some examples, a control terminal may refer to either the gate of a FET or the base of a BJT. Any other suitable transistor technologies can be used. Any such transistors can be used as a switch, with the gate and base or other comparable feature acting as a switch select input that can be driven to connect the source and drain (or the emitter and collector, as the case may be).

References herein to a field effect transistor (FET) being "ON" (or a switch being closed) means that the conduction channel of the FET is present, and drain current may flow through the FET. References herein to a FET being "OFF" (or a switch being open) means that the conduction channel is not present, and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible within the scope of the claims.

What is claimed is:

1. A circuit comprising:
   a first logic gate having a first input coupled to a first terminal;
   a second logic gate having a first input coupled to a second terminal, an output of the second logic gate coupled to a second input of the first logic gate;
   a first logic circuit;
   a voltage comparator having first and second comparator inputs and a comparator output, the first comparator input coupled to a voltage terminal, the second comparator input coupled to a reference voltage terminal, and the comparator output coupled to an input of the first logic circuit;
   a delay device having an input coupled to the second terminal, and an output of the delay device is coupled to a second input of the second logic gate; and
   a second logic circuit having a first input coupled to an output of the first logic gate, a second input coupled to an output of the first logic circuit, and having at least one fault detection output.

2. The circuit of claim 1, wherein the second logic circuit includes a third logic circuit having a clock terminal coupled to the output of the first logic gate and an input coupled to an output of the first logic circuit.

3. The circuit of claim 2, wherein the second logic circuit further comprises:
   a third logic gate having a first input coupled to the output of the second logic gate, a second input coupled to a fault terminal of the third logic circuit, and a third input coupled to the first terminal; and
   a fourth logic circuit having a clock terminal coupled to an output of the third logic gate and an input coupled to the output of the first logic circuit.

4. The circuit of claim 3, wherein the first, third, and fourth logic circuits are digital latches.

5. The circuit of claim 1, wherein the first and second logic gates are AND gates.

6. The circuit of claim 5, further comprising:
   an inverter coupled between the delay device and the second input of the second logic gate.

7. The circuit of claim 1, wherein the voltage terminal is coupled to the first terminal;
   wherein the voltage comparator is configurable to compare a test voltage at the first terminal to a reference voltage at the reference voltage terminal; and
   wherein, based on the test voltage being less than the reference voltage, the second logic circuit is configurable to monitor a first test signal produced at the output of the first logic gate in response to a second test signal applied to the second terminal, the second logic circuit being further configurable to produce, at the at least one fault detection output, a fault signal based on a failure of the first test signal to transgress a threshold value within a time period, the fault signal being indicative of a fault condition at the first terminal.

8. The circuit of claim 1, wherein the voltage terminal is coupled to a regulator output voltage feedback;
   wherein the voltage comparator is configurable to compare a test voltage at the voltage terminal to a reference voltage at the reference voltage terminal; and
   wherein, based on the test voltage being less than the reference voltage, the second logic circuit is configurable to monitor a first test signal produced at the output of the first logic gate in response to a second test signal applied to the second terminal, the second logic circuit being further configurable to produce, at the at least one fault detection output, a fault signal based on a failure of the first test signal to transgress a threshold value within a time period, the fault signal being indicative of a fault condition at the first terminal.

9. The circuit of claim 1, wherein the voltage terminal is coupled to one of: (i) a switching voltage terminal to receive a switching voltage of a power converter; or (ii) an output voltage feedback terminal to receive a feedback voltage representative of an output voltage of the power converter;

wherein the voltage comparator is configurable to compare a test voltage at the voltage terminal to a reference voltage at the reference voltage terminal; and wherein, based on a comparison of the test voltage to the reference voltage, the second logic circuit is configurable to monitor a first test signal produced at the output of the first logic gate in response to a second test signal applied to the second terminal, the second logic circuit being further configurable to produce, at the at least one fault detection output, a fault signal based on a failure of the first test signal to transgress a threshold value within a time period, the fault signal being indicative of a fault condition at the first terminal.

10. The circuit of claim 9, wherein the fault condition comprises at least one of an absence of a capacitor coupled to the first terminal, an absence of an inductor coupled to the first terminal, or a short circuit condition at the first terminal.

11. The circuit of claim 1, further comprising a transistor coupled between the first terminal and the first input of the first logic gate.

12. A circuit comprising:
a voltage comparator having first and second comparator inputs and a comparator output, the first comparator input coupled to a reference voltage terminal;
a first logic circuitry coupled to a first terminal, a second terminal, and the comparator output; and
a delay device coupled between the second terminal and the first logic circuitry, the delay device configurable to produce a delayed copy of a test signal applied at the second terminal;
wherein the first logic circuitry is configurable to produce a monitor signal based on a combination of the test signal, the delayed copy of the test signal, and a test voltage at the first terminal, and to produce a fault signal indicative of the fault based on a failure of the monitor signal to transgress a threshold value within a time period.

13. The circuit of claim 12, wherein the first logic circuitry comprises:
a first logic gate having a first input coupled to the first terminal;
a second logic gate having a first input coupled to the second terminal, a second input coupled to the delay device, and an output coupled to a second input of the first logic gate; and
a second logic circuit having an input coupled to the comparator output.

14. The circuit of claim 13, wherein the first logic circuitry further comprises a third logic circuit having a clock terminal coupled to an output of the first logic gate and an input coupled to an output of the second logic circuit.

15. The circuit of claim 14, wherein the first logic circuitry further comprises:
a third logic gate having a first input coupled to the output of the second logic gate, a second input coupled to a fault terminal of the third logic circuit, and a third input coupled to the first terminal; and
a fourth logic circuit having a clock terminal coupled to an output of the third logic gate and an input coupled to the output of the second logic circuit.

16. The circuit of claim 13, wherein the first and second logic gates are AND gates.

17. The circuit of claim 16, wherein a switch is coupled between an input supply voltage and first terminal; and wherein the fault comprises at least one of absence of a capacitor coupled between the switch and the first terminal, absence of an inductor coupled between the first terminal and a regulator output, or a short circuit condition at the first terminal.

18. The circuit of claim 12, wherein a switch is coupled between an input supply voltage and first terminal; wherein the second comparator input is coupled to the first terminal; wherein the voltage comparator is configurable to compare a test voltage at the first terminal to a reference voltage at the reference voltage terminal; and wherein the circuit is configurable to apply the test signal to actuate based on the test voltage being less than the reference voltage.

19. A regulator comprising:
a regulator output;
a first power transistor coupled between a first input voltage terminal and the first terminal;
a second power transistor coupled in series with the first power transistor between the first terminal and a reference;
a switch coupled between a second input voltage terminal and the first terminal; and
the circuit of claim 12.

20. The regulator of claim 19, wherein the second comparator input is coupled to the regulator output;
wherein the voltage comparator is configurable to compare an output voltage at the regulator output to a reference voltage at the reference voltage terminal; and
wherein the circuit is configurable to apply the test signal to actuate the switch based on the output voltage being less than the reference voltage.

21. A circuit comprising:
a comparator configurable to compare a voltage at a voltage terminal with a reference voltage;
a first logic circuit coupled to a first terminal and configurable to receive, responsive to the voltage at the voltage terminal being less than the reference voltage as indicated by the comparator, a test signal, the first logic circuit including at least one digital logic gate; and
an edge detection circuit configurable to (a) monitor a signal produced at an output of the at least one digital logic gate, and (b) based on the signal failing to transgress a threshold within a time period, providing a fault signal indicating detection of a fault at the first terminal.

22. The circuit of claim 21, further comprising:
a delay device configurable to produce a delayed copy of the test signal;
wherein the time period is based on a combination of the test signal and the delayed copy of the test signal.

23. The circuit of claim 22, wherein the at least one digital logic gate includes a first digital logic gate and a second digital logic gate, the second digital logic gate having a first input coupled to the first terminal and a second input coupled to an output of the first digital logic gate;
wherein the first digital logic gate is configurable to produce, at the output of the first digital logic gate, a window signal indicating the time period, the window signal being based on a combination of the test signal and the delayed copy of the test signal; and
wherein the second digital logic gate is configurable to produce the signal based on a combination of the test signal and the window signal.

24. The circuit of claim 23, wherein the edge detection circuit comprises a second logic circuit having an input coupled to an output of the second digital logic gate and configurable to provide the fault signal at an output of the second logic circuit.

25. The circuit of claim 21, wherein the fault indicates at least one of an absence of a capacitor coupled to the first terminal, an absence of an inductor coupled to the first terminal, or a short circuit condition at the first terminal.

26. The circuit of claim 21, wherein the voltage terminal is coupled to one of: (i) the first terminal; or (ii) an output voltage feedback terminal to receive a feedback voltage representative of an output voltage of a power converter.

* * * * *